United States Patent [19]
Dineen et al.

[11] Patent Number: 5,564,181
[45] Date of Patent: Oct. 15, 1996

[54] METHOD OF FABRICATING A LAMINATED SUBSTRATE ASSEMBLY CHIPS-FIRST MULTICHIP MODULE

[75] Inventors: Andrew Dineen, Derry, N.H.; George V. Ives, Wayland, Mass.

[73] Assignee: Draper Laboratory, Inc., Cambridge, Mass.

[21] Appl. No.: 424,712

[22] Filed: Apr. 18, 1995

[51] Int. Cl.⁶ .................................................. H05K 3/30
[52] U.S. Cl. ........................... 29/841; 29/836; 29/847
[58] Field of Search .......................... 29/834, 836, 841, 29/846, 847; 156/269; 174/52.2, 52.4, 260; 257/787, 788

[56] References Cited

U.S. PATENT DOCUMENTS

| | | | |
|---|---|---|---|
| 4,216,577 | 8/1980 | Badet et al. | 29/841 X |
| 4,635,356 | 1/1987 | Ohuchi et al. | 29/841 |
| 4,668,314 | 5/1987 | Endoh et al. | 156/269 X |
| 5,192,682 | 3/1993 | Kodai et al. | 29/841 X |
| 5,365,656 | 11/1994 | Dahringer et al. | 29/841 |

FOREIGN PATENT DOCUMENTS 176581  2/1971  Germany .................................. 29/841

OTHER PUBLICATIONS

IBM Techical Disclosure Bulletin, vol. 11, No. 8, Jan. 1969, p. 971.

*Primary Examiner*—Peter Vo
*Attorney, Agent, or Firm*—Iandiorio & Teska

[57] ABSTRACT

A laminated substrate assembly chip first multichip module and a method of making it includes a plurality of electronic components thinned to a predetermined thickness and mounting them on a flat substrate in a precise position and orientation; a mechanical spacer layer including a cured film and an adhesive bonded to the flat surface of the substrate surrounding the components; the mechanical spacer layer having a thickness approximately equal to the predetermined thickness of the components and a pattern of holes in it corresponding with the precise position and orientation of the components mounted on the substrate; and a cover layer bonded over the mechanical layer and the tops of the components.

8 Claims, 5 Drawing Sheets

5,564,181

METHOD OF FABRICATING A LAMINATED SUBSTRATE ASSEMBLY CHIPS-FIRST MULTICHIP MODULE

FIELD OF INVENTION

This invention relates to a laminated substrate assembly chips-first multichip module (MCM) and a method of making it.

BACKGROUND OF INVENTION

Chips-first multichip module fabrication may employ a number of approaches. One approach, the so-called General Electric/Texas Instrument High Density Interconnect (HDI) technique, requires that a hole be machined having a specific depth and location on the supporting substrate for each electronic component to be mounted. Electronic component means hereinafter an integrated circuit, resistor, capacitor or any other electrical device that may be associated with electronic circuits. The components are then placed in their tailored holes so that the tops of the components in conjunction with the remaining lands or plateaus of the substrate create a planar surface. A solid continuous encapsulating layer is then bonded to the components and substrate. This technique has a number of shortcomings. Since the dimensions of even the same component varies from piece to piece the holes must be made larger than the largest tolerance expected for that component. This increases the area required for each component and reduces the overall packing density obtainable. Also reducing that density is the fact that the holes cannot be contiguous: they must have a land or plateau between them. Further, since the holes are larger than some of the components, the components can assume a variety of orientations, which requires that a large and expensive laser lithography technique be used to properly identify the orientation of each component. Also, the substrates have to be thicker than the thickest component, which adds to the weight and cost of the finished device. Further, removing defective components from such holes or recesses is extremely costly. Another approach, the Integrated System Assembly (ISA) process, thins every component to be mounted to a predetermined thickness and then mounts them directly on the substrate. Following this, an uncured polymer is dispensed onto the substrate around the component. After curing the entire assembly is ground down to obtain a flat surface for receiving subsequent layers. One disadvantage of this process is that cured polymers shrink, this induces stresses in the substrate, which can cause premature failure. Failure requires that all layers subsequently added after encapsulation be removed in order to remove the component. This can be extremely time consuming and expensive.

SUMMARY OF INVENTION

It is therefore an object of this invention to provide an improved laminated substrate assembly chips-first multichip module (MCM) and method of making it.

It is a further object of this invention to provide such an improved laminated substrate assembly chips-first multichip module (MCM) and method of making it which uses inexpensive laminating materials and is inexpensive to make.

It is a further object of this invention to provide such an improved laminated substrate assembly chips-first multichip module (MCM) and method of making it which induces no residual stress in the substrate and components.

It is a further object of this invention to provide such an improved laminated substrate assembly chips*first multichip module (MCM) and method of making it in which repair is simpler and less costly.

It is a further object of this invention to provide such an improved laminated substrate assembly chips-first multichip module (MCM) and method of making it which provides greater packing density.

It is a further object of this invention to provide such an improved laminated substrate assembly chips-first multichip module (MCM) and method of making it in which substrate size and thickness can be greatly reduced.

It is a further object of this invention to provide such an improved laminated substrate assembly chips-first multichip module (MCM) and method of making it which uses standard conventional equipment for fabrication.

The invention results from the realization that a truly simple yet extremely efficient and economic technique of enclosing electronic components in a chips-first multichip module can be achieved by thinning each component to be mounted on the substrate to a predetermined thickness, mounting them on a flat substrate, bonding to the substrate a mechanical spacer layer consisting of a cured film and an adhesive which is approximately the same thickness as the predetermined thickness such that a substantially planar surface is defined by the tops of the components and mechanical spacer layer, and adding a cover layer over both the components and mechanical spacer layers.

This invention features a method of fabricating a laminated substrate assembly chips-first multichip module including mounting a plurality of electronic components having a predetermined thickness to a flat substrate in a precise position and orientation. A mechanical spacer layer including a cured film and an adhesive is bonded on the substrate and about the components. The mechanical spacer layer has approximately the same predetermined thickness as the components and has a plurality of holes with the precise position and orientation of the components mounted on the substrate. A cover layer is bonded over the mechanical spacer layer and the tops of the components.

In a preferred embodiment, the components may all have the same predetermined thickness. That predetermined thickness may be 6 mils. The mechanical spacer layer may include a cured film and an adhesive which are polymeric materials. The cover layer may include a cured film and an adhesive which are polymeric materials. The mechanical spacer layer may be equal to or greater than the predetermined thickness. The holes in the mechanical spacer layer may be approximately the same size as the components.

This invention also features a laminated substrate assembly chips-first multichip module which includes a flat substrate and a plurality of electronic components of predetermined thickness mounted on the substrate in a precise position and orientation. A mechanical spacer layer is bonded to the substrate and about the components having a thickness approximately equal to the predetermined thickness and having a pattern of holes with the same location and orientation of the components. A cover layer is bonded over the mechanical spacer layer and the tops of the components.

In a preferred embodiment the electronic components may include at least one of an integrated circuit, resistor or capacitor. The components may all be of the same thickness. The predetermined thickness may be 6 mils. The mechanical spacer layer may include a cured film and an adhesive which may be polymeric materials as may the cover layer. The encapsulating mechanical spacer layer may be equal to or greater than the predetermined thickness and the holes may be approximately the same size as the components.

DISCLOSURE OF PREFERRED EMBODIMENT

Other objects, features and advantages will occur to those skilled in the art from the following description of a preferred embodiment and the accompanying drawings, in which.

Figure 1:
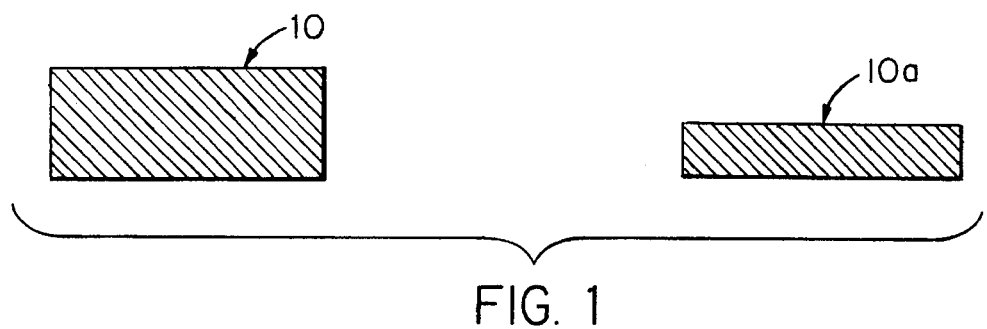
FIG. 1 is a schematic view showing an original device and that device after it has been thinned to a predetermined thickness according to this invention.
Figure 2:
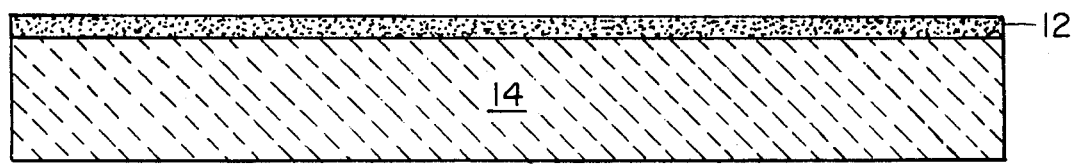
FIG. 2 is a schematic sectional view showing a substrate with bonding material disposed on it according to this invention.
Figure 3:
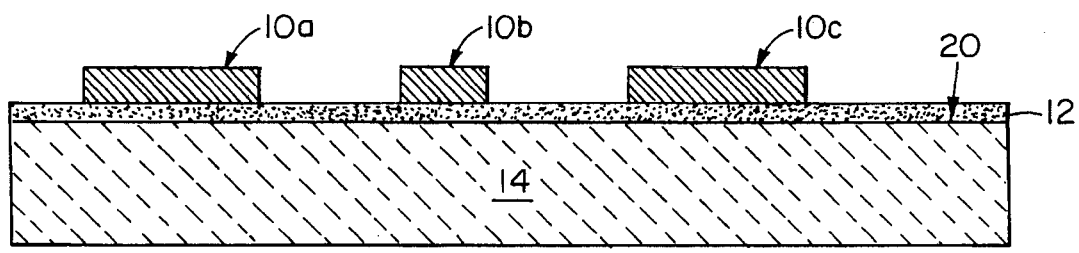
FIG. 3 is a schematic side sectional view similar to FIG. 2 with the thinned devices of FIG. 1 mounted on it.
Figure 4:
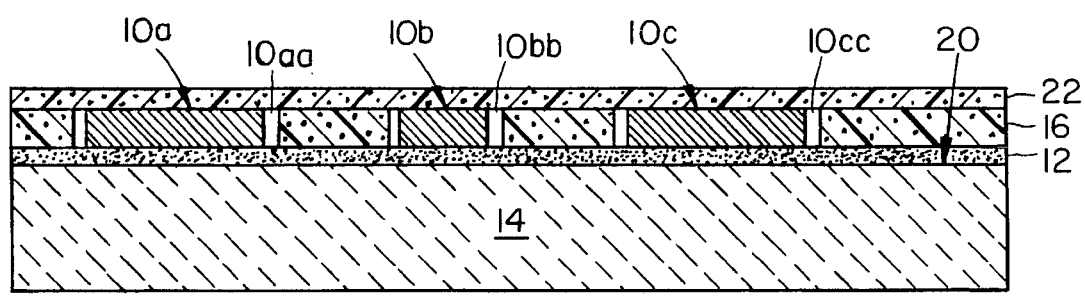
FIG. 4 is a schematic side sectional view similar to FIG. 3 with the mechanical spacer layer and the cover layer installed according to this invention.

There is shown in FIG. 1 an electric component 10 which may be an integrated circuit chip, a resistor, a capacitor, or a similar device having a particular thickness. In accordance with this invention the device is thinned down by back side grinding to a predetermined thickness, for example, in this case, 6 mils, so that the component appears as at 10a. Following this, in accordance with the method of the invention, a die attach material 12, FIG. 2, is deposited on substrate 14. The die attachment material 12 may be a UV curable glue or adhesive such as a polyamide, for example Ciba Geigy No. 7005. The substrate may be made of any suitable material such as alumina, beryllia, or similar materials, and is typically approximately 10 to 25 mils thick. Thinned chips 10a, 10b, 10c, FIG. 3, or other electronic components are then pressed onto the adhesive 12 on substrate 14 with a force of approximately 30 to 80 grams to ensure that they bond. Components 10a, 10b and 10c are carefully, precisely located and oriented on substrate 14. Following this, a mechanical spacer layer 16 is placed on substrate 14 around components 10a, b and c. The adhesive of the mechanical spacer layer may be preapplied to the cured film or may be added during the lamination process. The cured film may be any pre-cured polymer film such as Kapton, and the adhesive may be any number of different materials, such Rogers Rflex-1000. This adhesive is used to adhere the cured film of the mechanical spacer layer 16, FIG. 4, to the surface of substrate 14. Holes 10aa, 10bb and 10cc in mechanical spacer layer 16 are precisely located and oriented with respect to the location orientation of the respective components 10a, 10b, 10c, which they will receive so that mechanical spacer layer 16 registers exactly with them on substrate 14. Typically the mechanical spacer layer may be any suitable material, for example Kapton, available from DuPont, and it should have approximately the same thickness as the thin devices 10a, 10b, 10c, in this case 6 mils. The mechanical spacer layer 16 consisting of cured film and adhesive is approximately equal to the thickness of the thin devices 10a, 10b, 10c. It may be exactly equal to that dimension or it may be slightly larger, but preferably is not made any smaller since if it were smaller the components would rise above the layer and be subject to excessive lamination forces.

Figure 5:
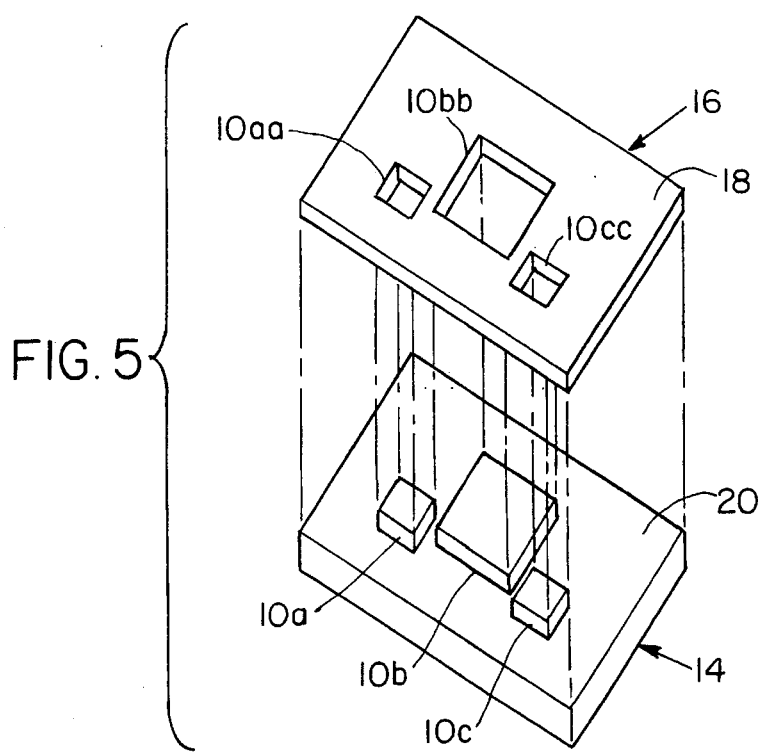
FIG. 5 is an exploded axonometric view showing the mechanical spacer layer of FIG. 4 and the substrate with the components mounted on it.

The relationship of mechanical spacer layer 16 and components 10a, 10b, 10c on substrate 14 can be seen more readily in FIG. 5, where it is clearly illustrated that the apertures or holes 10aa, 10bb and 10cc in mechanical spacer layer 16 have been precisely located and oriented so that they match exactly with the precise location and orientation of components 10a, 10b and 10c on substrate 14. Also, the thickness of mechanical spacer layer 16, being equal or approximately equal to the height of components 10a, 10b and 10c ensures that after installation each of the components 10a, 10b, 10c will neatly and precisely fill their respective holes 10aa, 10bb, 10cc and create a flat planar surface formed by the tops of components 10a, 10b, 10c and the top surface 18 of mechanical spacer layer 16.

Note that surface 20 of substrate 12 is flat or planar and is provided with no recesses or holes to receive components 10a, 10b and 10c. Rather, components 10a, b and c are mounted directly on the flat planar surface 20 of substrate 14. A cover layer 22, FIG. 4, consisting of a cured film and an adhesive which may be integral to the spacer layer or added as a separate process step and is finally added in keeping with this invention on top of mechanical spacer layer 16 to cover spacer layer 16 and the tops of each of components 10a, b and c. Cover layer 22 may be made of any suitable material and need not be the same as the material used for mechanical spacer layer 16. In this particular instance, however, it is: a 1.0 mil thick Kapton sheet and an adhesive is used for layer 22.

Figure 6:
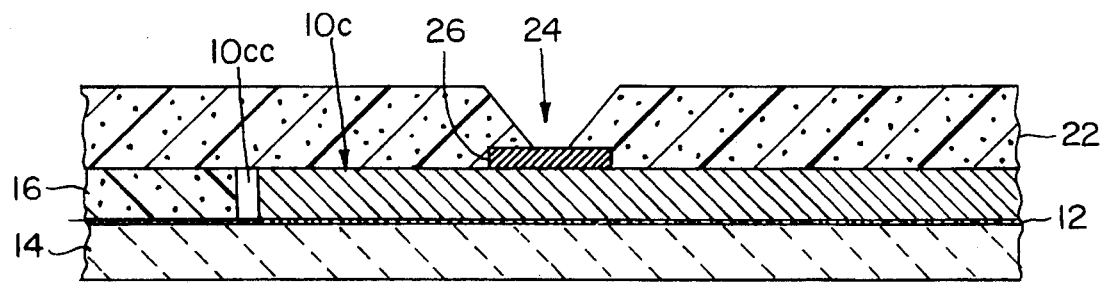
FIG. 6 is an enlarged detailed view of a portion of FIG. 4 with a via through the cover layer that has been produced by a technique such as plasma etching, reactive ion etching or laser drilling.
Figure 7:
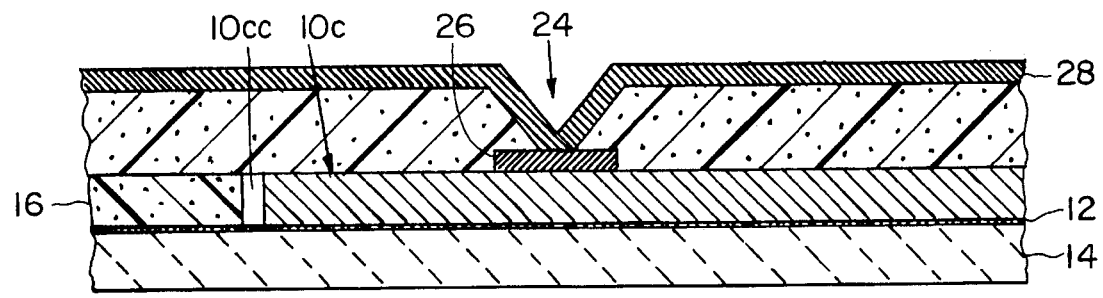
FIG. 7 is a view similar to FIG. 6 with the metalization added.
Figure 8:
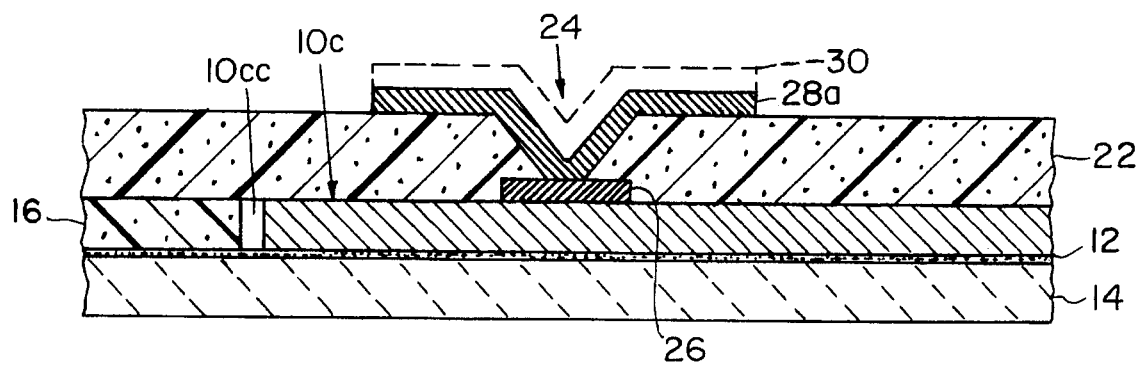
FIG. 8 is a view similar to FIG. 7 with portions of the metalization etched away to form a conductor pattern.
Figure 9:
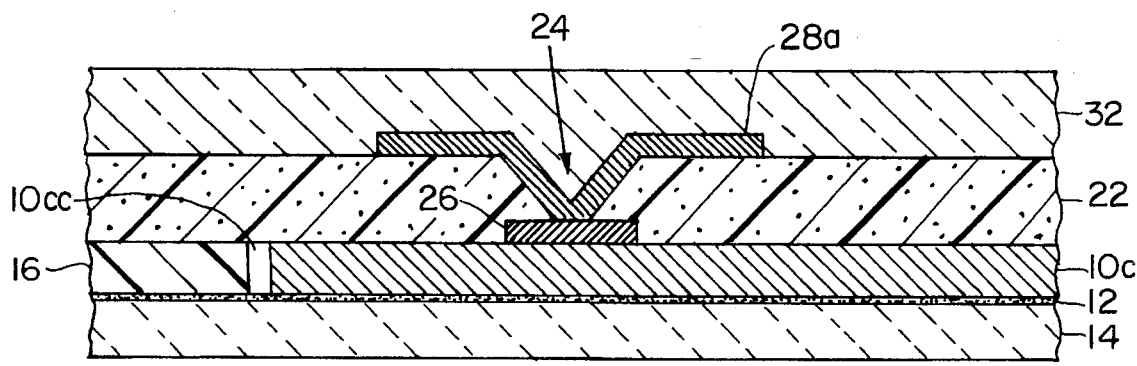
FIG. 9 is a view similar to FIG. 8 with a dielectric layer applied over the etched metalization layer.
Figure 10:
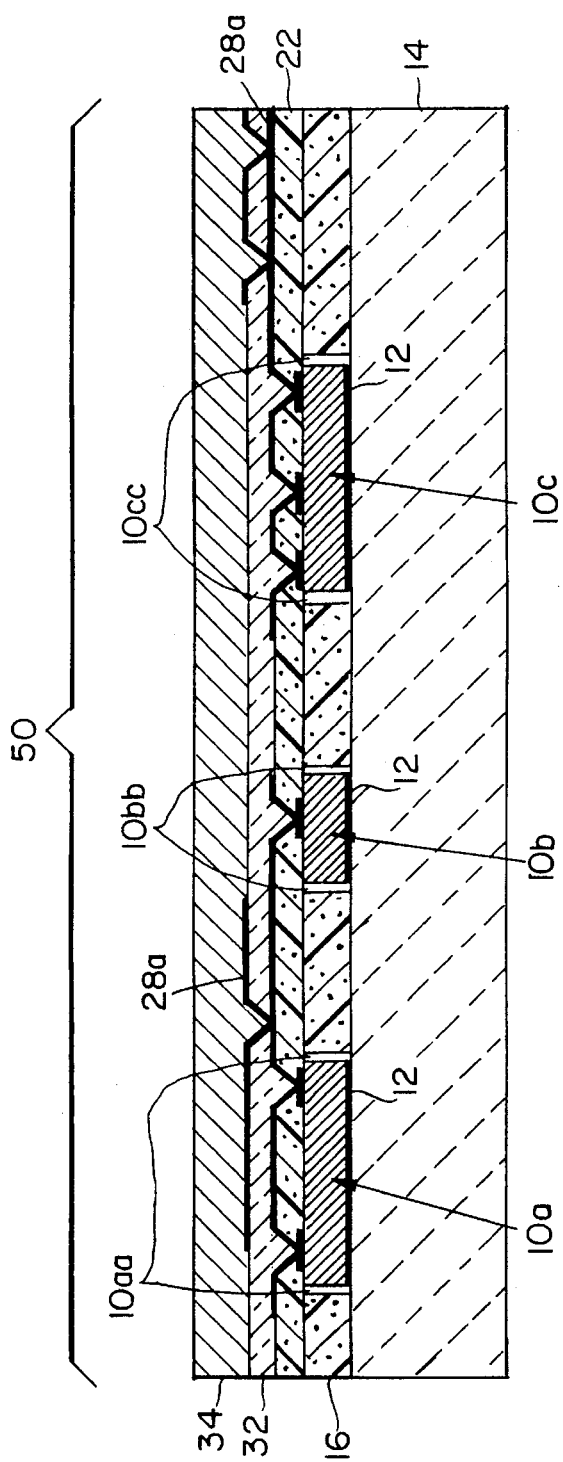
FIG. 10 is a view of the complete two conductor layer multichip module assembly as it appears after completion.
Figure 11:
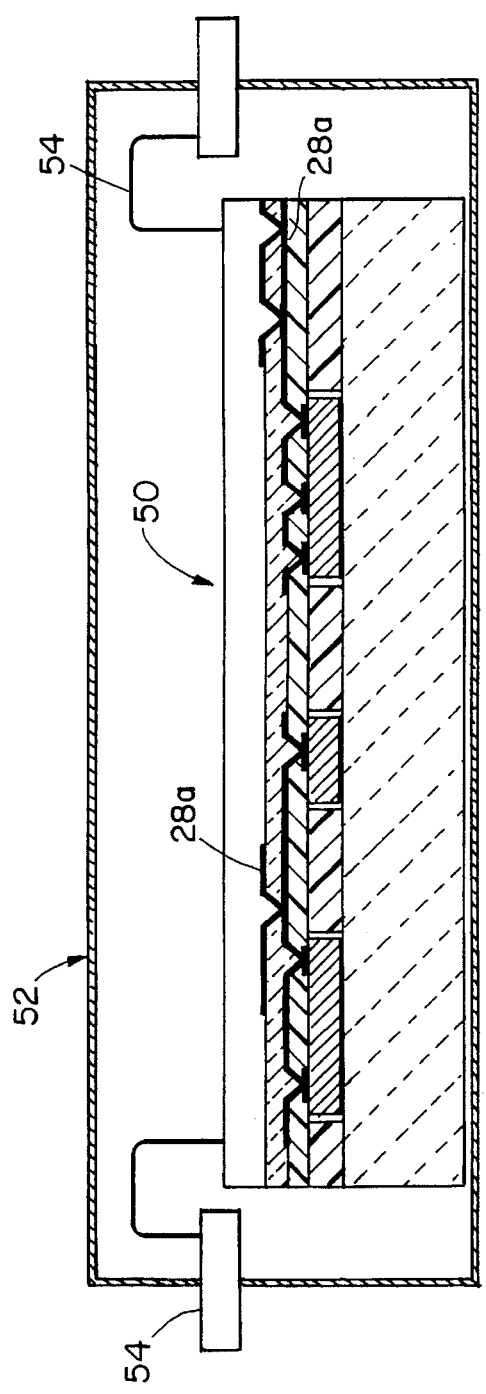
FIG. 11 is a view similar to FIG. 10 with the multichip module installed in a package for testing.

After the method according to this invention is completed, typical additional steps, FIG. 6, include using a technique such as laser drilling to produce a layer-to-layer interconnect, via 24 through cover layer 22 and providing a conductive pad 26 at the bottom of via 24 disposed on top of component 10c. Following this a metalization layer 28, FIG. 7, is applied by first sputtering an adhesive layer such as chromium and then copper, then electroplating copper, and then optionally sputtering chromium again. A photoresist layer 30 is applied and processed. The result is as shown in FIG. 8 in phantom, and then the metal layer 28 is etched away everywhere but under photoresist 30, leaving the conductor pattern 28a, FIG. 8. Following this a dielectric layer 32 may be applied. The steps shown in FIGS. 6–9 inclusive may be repeated as many times as necessary to create the necessary features. An optional finish layer 34 is then applied, FIG. 10, and the entire multichip module 50, FIG. 11, may be installed in a package 52 with external contacts 54 for higher level interconnect and further testing.

Figure 12:
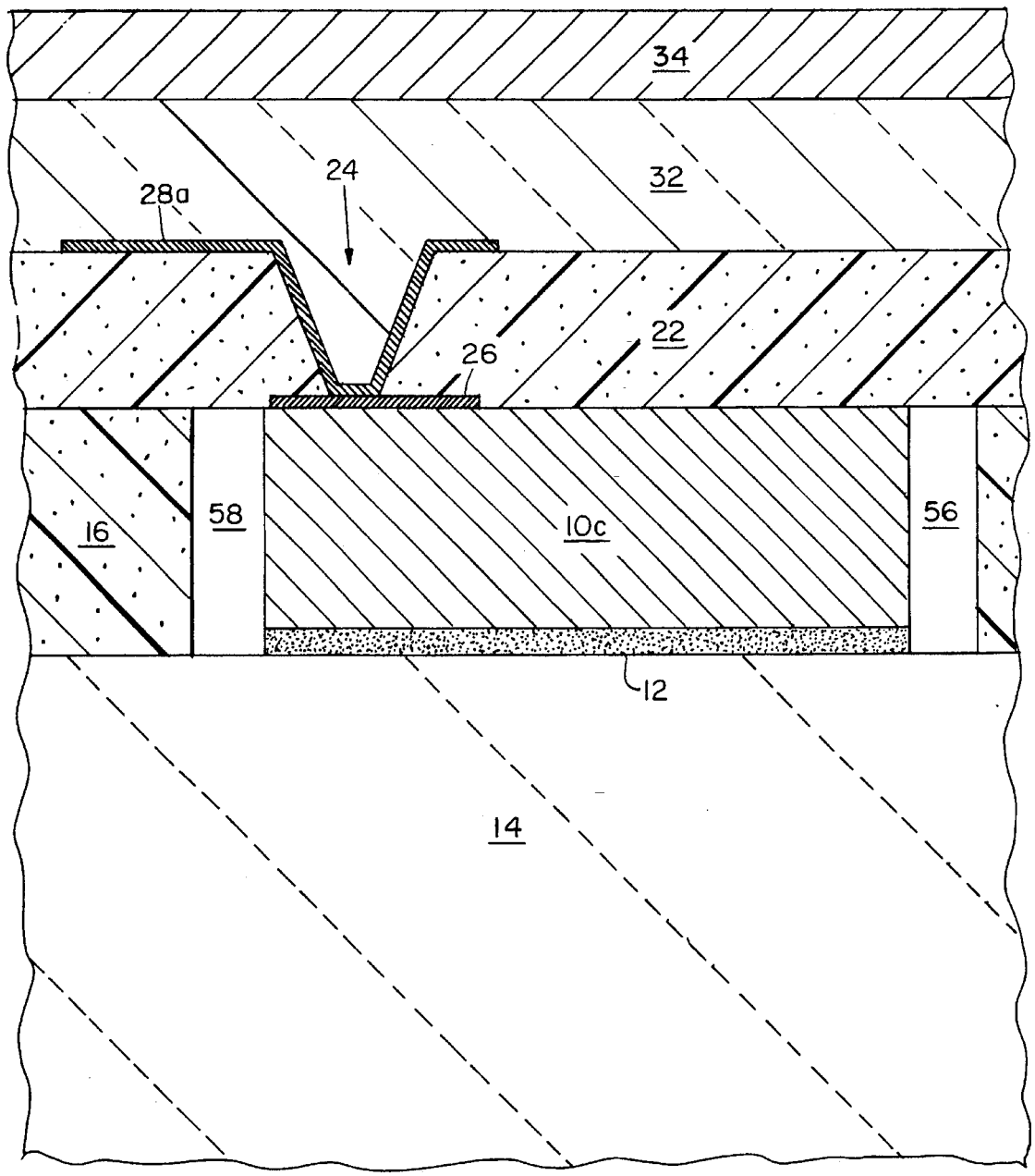
FIG. 12 is a side schematic sectional view of a laminated chips-first multichip module according to this invention.

The finished laminated substrate assembly chips-first multichip module 50 is shown in greater detail in FIG. 12, where substrate 14 clearly supports the mechanical spacer layer 16 which surrounds component 10c bonded to substrate 14 by adhesive 12. The space 56, 58 surrounding component 10c and mechanical spacer layer 16 consisting of cured film and adhesive may be filled by the glue or adhesive from spacer layer 16 which is used to adhere layer 16 to substrate 14 in addition to the glue or adhesive from cover layer 22. The time, temperature and force of lamination of layer 16 can be adjusted to allow the adhesive to flow along the surface of substrate 14 into spaces 56 and 58 so that any voids or air pockets are eliminated and filled with the adhesive.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A method of fabricating a laminated chips-first multichip module (MCM) comprising:

mounting a plurality of electronic components all having a predetermined thickness to a flat substrate in a precise position and orientation;

bonding on said substrate and about said components a mechanical spacer layer including a cured film and an adhesive having approximately said predetermined thickness and having a pattern of holes with the precise position and orientation of said components mounted on said substrate such that a substantially planar surface is defined by the tops of the components and the mechanical spacer layer; and bonding a cover layer over said mechanical spacer layer and the tops of said components.

2. The method of claim 1 in which said components all have the same thickness.

3. The method of claim 1 in which said predetermined thickness is approximately 6 mils.

4. The method of claim 1 in which said mechanical spacer layer are polymeric materials.

5. The method of claim 1 in which the cured film and adhesive of said mechanical spacer layer are polymeric materials.

6. The method of claim 1 in which said mechanical spacer layer is equal to or greater than said predetermined thickness.

7. The method of claim 1 in which said holes are approximately the same size as said components.

8. A method of fabricating a chips-first multichip module (MCM) comprising:

trimming a plurality of electronic components to a predetermined thickness;

mounting the bottoms of said components to a substrate;

bonding on said substrate and about said components the bottom of a mechanical spacer layer having approximately said predetermined thickness and having a pattern of holes with the precise location and orientation of said components mounted on said substrate, the top of said spacer layer approximately flush with the tops of said components; and bonding a cover layer over said mechanical spacer layer and the tops of said components.

* * * * *